Figure 1:
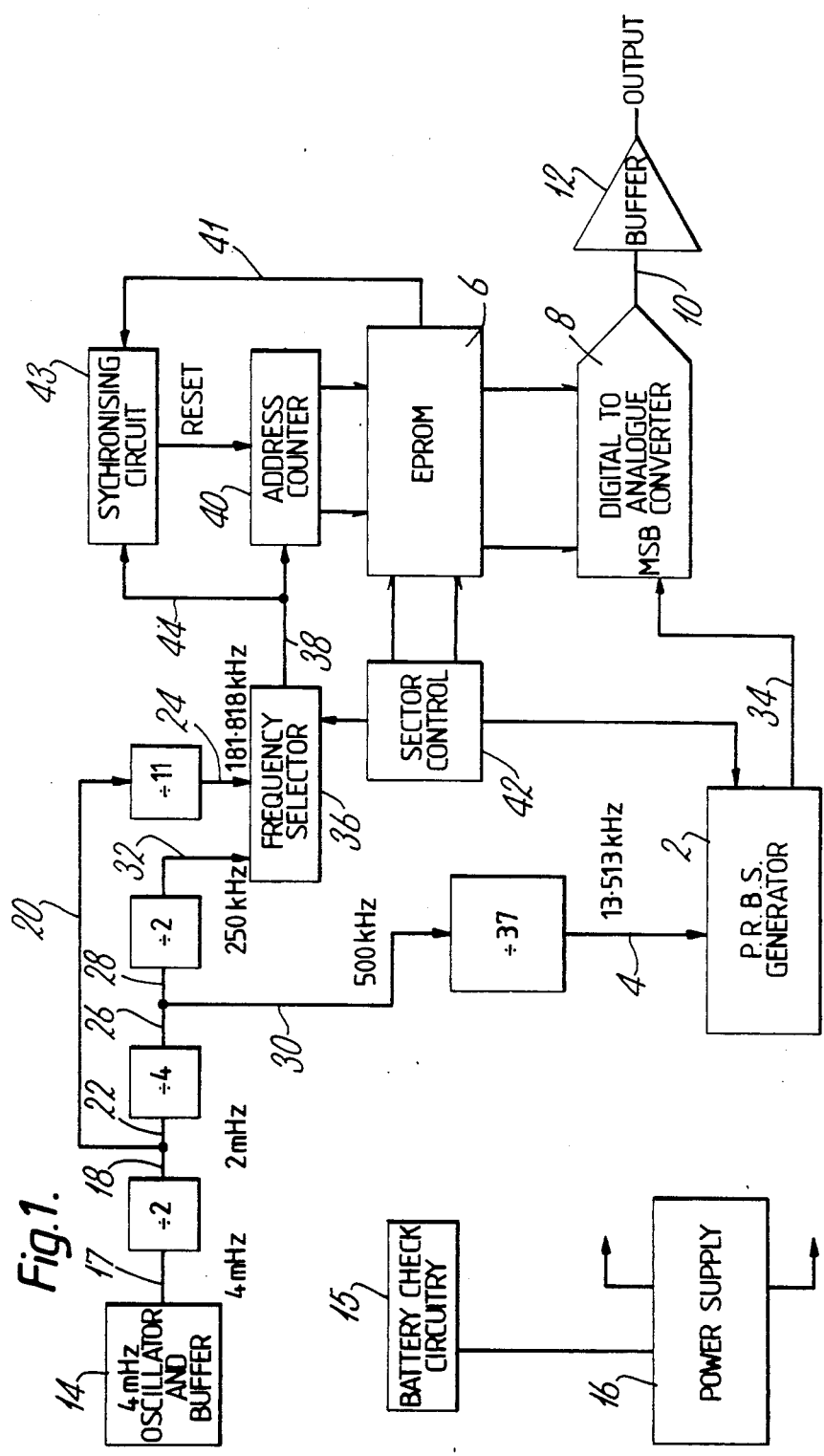

United States Patent [19]

Brown et al.

[11] Patent Number: 4,673,871

[45] Date of Patent: Jun. 16, 1987

[54] DIGITAL NOISE GENERATOR

[75] Inventors: John D. Brown; Peter Gladdish, both of Derby; Michael A. McCormick, Nottingham, all of England

[73] Assignee: Rolls-Royce Limited, London, England

[21] Appl. No.: 812,630

[22] Filed: Dec. 23, 1985

[30] Foreign Application Priority Data

Jul. 27, 1985 [GB] United Kingdom ............... 8519006

[51] Int. Cl.⁴ ............................................. G01R 19/00
[52] U.S. Cl. ................................. 324/76 R; 331/78; 364/717
[58] Field of Search ................ 324/76 R, 77 R, 77 A, 324/57 N, 77 B, 77 C, 77 CS, 78 E, 78 D, 79 D; 331/78; 364/717; 381/58; 333/28 T; 455/226; 84/1.23, 1.24

[56] References Cited

U.S. PATENT DOCUMENTS

| | | | |
|---|---|---|---|
| 4,270,430 | 6/1981 | Deutsch | 84/1.24 |
| 4,306,113 | 12/1981 | Morton | 455/226 |
| 4,375,620 | 3/1983 | Singer et al. | 331/78 |

Primary Examiner—Michael J. Tokar
Attorney, Agent, or Firm—Cushman, Darby & Cushman

[57] ABSTRACT

A digital noise generator for use in aeroengine noise testing can accurately and repeatably reproduce a standard noise spectrum so that differing noise analysis systems can be calibrated to a common standard. The noise generator comprises a pseudo-random binary sequence generator which is fed with a low clock frequency derived from a high frequency crystal oscillator. The generator produces a pseudo-random noise single bit signal which is fed to the most significant bit input of a digital to analogue converter, whose other inputs are fed with simulated tone data residing within an EPROM, the pseudo-random and tone noise thereby being digitally summed before conversion to an output analogue signal of desired spectral characteristics.

5 Claims, 2 Drawing Figures

DIGITAL NOISE GENERATOR

This invention relates to digital noise generators, particularly one which can accurately and repeatably synthesise a standard representation of an aeroengine noise spectrum for the purpose of accurate calibration of differing noise analysis systems to a common standard.

The imposition of strict environmental noise standards on the operation of aircraft has made it necessary for manufactures and operators of aircraft and their engines to impose rigorous noise checking and analysis procedures during testing of aeroengines both when installed in the aircraft and before installation, to ensure that noise standards are observed and that the regulatory authorities will grant appropriate operational certification. The checking and analysis procedures involve magnetic tape replay systems and spectrum frequency analysis systems which differ as between the various companies and organisations involved, and consequently the regulatory authorities require that equivalency between analyses of aeroengine noise signals performed on different analysis systems be demonstrated and guaranteed. These systems must therefore be calibratable to a known standard and acceptable to certificating authorities for the provision of certification data.

One current known standard involves the production of a "white noise" signal which is converted to analogue form and then electronically filtered to get a desired "pink noise" signal characteristic, e.g. a roll-off from the peak at 3 dB per octave. This simulated broadband engine noise is then used for testing the response of filters in the analysis system to ensure consistent analysis of engine noise data.

One problem with the known sort of device for producing a standard noise signal is that manufacturing tolerances in the electronic analogue components, such as the filters used to produce the pink noise, cause different devices to have slightly different characteristics even if nominally identical components are used. Another allied problem is the medium to long term change or "aging" of characteristics of the components. Such aging means that the noise analysis system is no longer accurately calibratable by the device incorporating the aging components, unless the device itself is regularly recalibrated against an "absolute" standard.

A further problem is that the known devices cannot provide a signal to test the response of the noise analysis filters to engine order tones and their harmonics, which are also present in the noise spectra of aeroengines.

The present invention overcomes the above problems by using digital techniques to synthesise a noise signal containing pink noise and/or tone components.

According to the present invention a digital noise generator, for producing a noise spectrum signal representative of the noise spectrum of a gas turbine aeroengine, includes:

an oscillator having a high pulse frequency output;

a pseudo-random binary sequency generator driven by a low frequency clock signal derived from the output of the oscillator thereby to produce a pseudo-random digital noise signal with a spectrum having a broadband pink noise component in the audio range;

a read-only memory having at least one memory block therein containing simulated tone data in memory address sequence order;

means for addressing the at least one memory block whereby the simulated tone data is outputted from the read-only memory in memory address sequence order thereby to produce a tone signal in digital form; and means for selectively summing the pseudo-random noise signal and the tone signal thereby to produce the noise spectrum signal.

It will be seen that the invention avoids the use of innacurate or degradeable analogue systems as far as possible by synthesising an engine noise spectrum as a digital signal.

The means for summing the pseudo-random noise signal and the tone signal preferably comprises a digital-to-analogue converter, the pseudo-random noise signal being fed to the most significant bit input of the digital-to-analogue converter and the tone signal being fed to the lower bit inputs thereof thereby to produce the noise spectrum signal in analogue form.

In order that a variety of noise spectra can be produced to more adequately test response of noise analysis systems to a variety of tones, or tones and their harmonics, the read-only memory preferably comprises a plurality of memory blocks each containing simulated tone data in memory address sequence order, the digital noise generator further comprising means for selectively addressing the memory blocks whereby the simulated tone data is outputted from the selected memory block in memory address sequence order thereby to produce a selected tone signal in digital form. Of course, since the pseudo-random noise signal and the tone signal are summed selectively according to the type of noise spectrum output required, each tone signal, or tone plus harmonics signal, produced by the read-only memory can be outputted from the device either with or without combination with the pink noise signal.

We prefer that the read-only memory is addressed by an address counter provided with a clock frequency input switchable between a plurality of clock frequencies, whereby a block of memory being addressed can be addressed at a plurality of rates in order to produce a corresponding plurality of tones from the simulated tone data held in the memory block.

Further aspects of the invention will be apparent from a perusal of the following description and claims.

Figure 2:
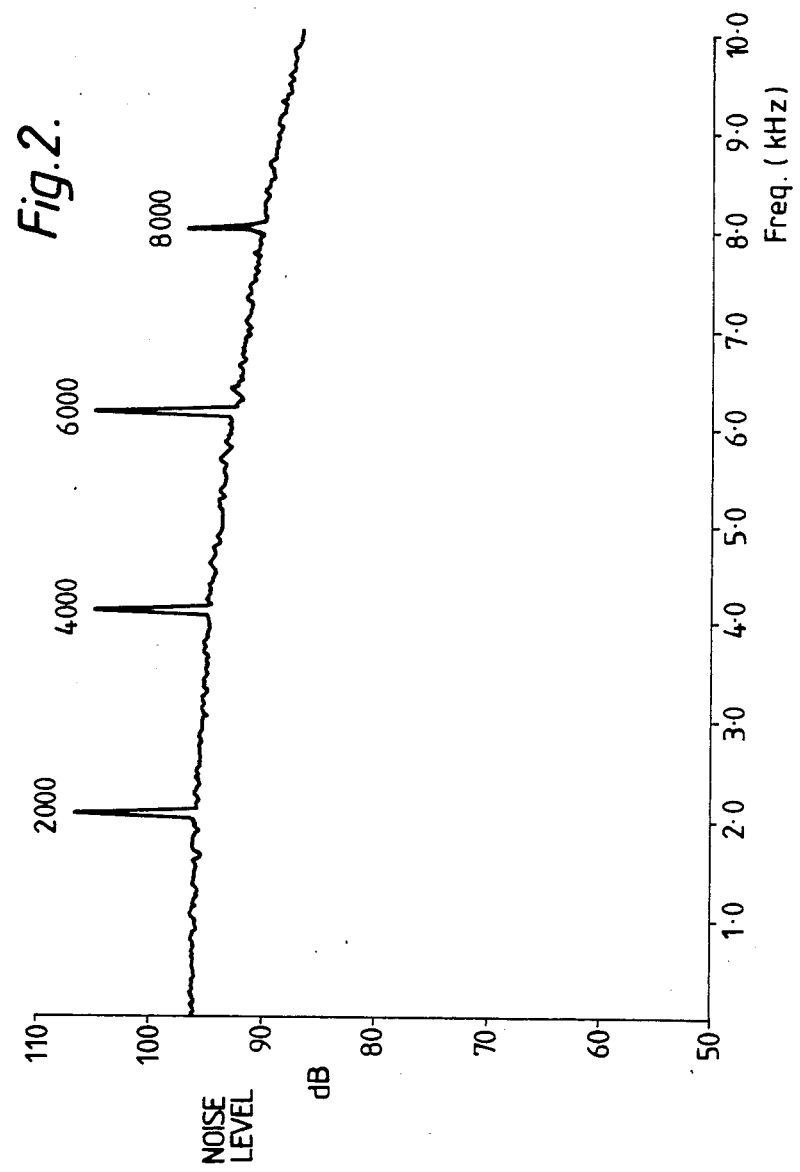

An embodiment of the invention will now be described, by way of example only, with reference to the accompanying drawings, in which FIG. 1 is a block diagram of a digital noise generator according to the invention;

FIG. 2 is a graphical representation of the output of the generator of FIG. 1, expressed as a plot of deciBels against frequency in KHz.

Refering first to FIG. 1, the digital noise generator, shown here in block diagram form, is for use as a calibration noise source for calibration of ⅓ octave noise spectrum analysers. One example of such an analyser is the Bruel and Kjaer Digital Frequency Analyser type 2131, which we use for analysis of aeroengine noise spectra.

Described briefly, the noise generator comprises a PRBS (pseudo-random binary sequence) generator 2 which is fed with a low clock frequency on line 4 to produce a pseudo-random noise signal. The noise generator also incorporates an EPROM 6, which holds at various memory address blocks, data representing various tones. The pseudo-random noise signal and the tone signals are both fed to the inputs of a digital-to-analogue (D/A) converter 8, where the two types of signal are summed digitally before converstion to an output analogue signal on line 10. The analogue signal is then preferably buffered in suitably modified operational amplifier 12 where the bandwidth is reduced by giving the signal a slight roll off. A typical example of the sort of signal that can be produced by this generator is shown in FIG. 2.

In more detail, the master clock for the PRBS generator 2 is a 4 MHz crystal oscillator 14 which is stimulated into oscillation by a MOSFET amplifier (not shown). Since power needs for the MOSFET amplifier and the other components are small, the power supply can conveniently be just one PP9 battery, having associated battery check circuitry 15.

The 4 MHz clock signal on line 17 is first passed to a "divide by two" register as shown and the resulting signal on line 18 is then passed into two parallel branches 20,22, where the clock signal is further divided by 11 and 4 respectively to produce frequencies of 181.818 KHz and 500 KHz on lines 24 and 26. The 500 KHz signal on line 26 is passed into two further parallel branches 28 and 30, the clock signal being divided yet again in these branches by 2 and 37 respectively to produce frequencies of 250 KHz and 13.513 KHz on lines 32 and 4 respectively.

As previously stated, the 13.513 KHz signal on line 4 drives the PRBS generator 2, which is simply a shift register whose input is fed back from a signal which is logically derived from two or more of the shift register's outputs, the outputs being exclusive-ORed together and selected with respect to the bit length of the shift register in order to achieve the maximum sequence length without repeating patterns. The theoretical maximum non-repeating sequence length is always $2^{n-1}$, where n is the number of stages in the register. If analysed, this sequence will give a spectrum whose envelope will follow a $(\sin x/x)^2$ characteristic which has a null at the input clock frequency and its multiples, where $x = \pi f/c$, f being output frequency in KHz and c being the clock frequency, in this case 13.513 KHz In the prior device previously acknowledged, a pseudo-random noise signal is also produced, but is sharply filtered such that only part of it remains, giving a "white" noise signal (i.e. equal energy per unit bandwidth) to within $\pm 0.1$ dB. In order to represent the broadband noise content of the noise output of an aeroengine, the white noise signal would then normally have to be further modified to a "pink" noise signal by further filtering with a more complex and hence inherently unreliable filter. However, in the present invention use is made of the inherent roll-off of that initial (low frequency) part of the $(\sin x/x)^2$ PRBS generator output characteristic which reaches a null at $f=c$, in that the input clock frequency on line 4 has been reduced to a low level by the prior division, thereby bringing into the audio range the initial part of the $((\sin x)/x)^2$ characteristic which comprises the spectrum of the output noise signal on line 34. It is this low frequency portion of the characteristic which is used to simulate the broadband "pink" noise component of the aeroengine noise spectrum.

Returning to the top of FIG. 1, the 181.818 and 250 KHz signals on lines 24 and 32 respectively are selected as required via a frequency selector 36 and the selected signal on line 38 is fed to the clock input of an address counter 40. This counter 40 is used to address the locations of the simulated tone data residing within EPROM 6, and if left to itself would cycle through 128 consecutive addresses continuously, this being the maximum size of each data block within the EPROM. The EPROM may have, for instance, a nominal 2 KByte capacity (8 bits = 1 byte).

The content of the EPROM's output signal to the D/A converter 8 is controlled by means of the sector control switch 42, which in the present case is a multiposition thumbwheel switch. This controls a set of contacts which are closed and open in various combinations according to the thumbwheel position. One of the contacts switches the frequency selector 36 between the 181.818 and 250 KHz signals. Another contact switches the output of the PRBS generator 2 on and off line 34 (this copes with cases where the device is only required to output a tone signal without the broadband noise signal). The contacts are also connected to pins on the EPROM controlling which block of addresses are being scanned by the address counter 40 at any particular position of the thumbwheel.

Looking at the contents of the EPROM in more detail, data representing several discrete engine order tones, and also, if desired, engine order tones plus their harmonics, are stored therein at several blocks of addresses. In each block, each location contains an 8-bit byte, the tone data being 7 bits wide and the eighth bit being used as a flag to reset the address counter 40. As each ROM location is addressed in turn by the address counter 40, the tone data contents of that address are fed as a 7-bit word to the lowest 7 input bits of the D/A converter 8, while the eighth bit is fed on line 41 to a synchronising circuit 42 which resets the address counter as described below whenever the eighth bit is a 1.

Each block of locations comprises 128 addresses or less and in analogue terms represents one complete waveform or cycle of a sound signal; for instance, a pure tone is always represented by data from successive addresses whose values, if plotted against time, would trace out a sine wave. The frequency of the waveform—i.e. the tone actually generated by the EPROM—is decided by two factors, namely the rate at which the address counter scans the relevant block of tone data, and the number of addresses in the block. With respect to the first factor, note that by virtue of the two different clock frequencies applied to the address counter 40 on line 38, each block of locations can in fact represent two different tones and two different sets of harmonics (if present). This is because the address counter scans the tone data at a faster rate if clocked with the 250 KHz signal instead of the 181.818 KHz signal. Of course, if desired, further clock signals of differing frequency could be derived and applied to the address counter through a suitable switching arrangement, thereby enabling a wider range of tones to be generated from the same data.

With respect to the second factor, note that if data defining a waveform is held in a block of, say, 120 addresses and also in another block of 128 addresses, a higher tone will be generated by scanning the block of 120 addresses at a certain rate than will be generated by scanning the block of 128 address at the same rate.

As mentioned previously, the address counter 40 can cycle continuously through 128 consecutive addresses if left to itself. However, if the data block being scanned is less than 128 addresses long, say 120, it is plain that the address counter must be reset to zero each time it has counted up to 119 from zero. As also mentioned previously, this is accomplished by ensuring that the flag bit at address 119 is set to 1, this bit being 0 at all other addresses in the block.

Besides receiving the flag bit from EPROM 6 on line 41 each time an address block has been scanned, the synchronising circuit 42 also receives the currently selected clock frequency signal on line 44. In order for the synchronising circuit 42 to reset the address counter 40 to zero upon receipt of the flag bit, it must also receive, substantially simultaneously, a clock pulse. This eliminates erroneous resets caused by unstable data appearing on the output of EPROM 6 during address changeovers.

Turning now to the final production of the desired audio signal, this is achieved by first summing the tone and pseudo-random noise signals in the 8-bit D/A converter 8. The seven-bit tone data words from EPROM 6 are fed to the lowest seven bit inputs of the D/A converter as mentioned previously, whilst the single bit data stream from the PRBS generator is fed to the most significant bit input so that the summing is effected digitally. The D/A converter 8 therefore produces an output frequency spectrum which in the frequency range of interest for aeroengine noise analysis consist of a certain level of pseudo-random broadband noise, with added peaks comprising the simulated engine order tones plus any harmonics which are present. Finally the output of the D/A converter 8 on line 10 is passed through a buffer 12 comprising an operational amplifier and a smoothing/filter circuit. The latter component of buffer 12 is a low pass filter which suppresses all frequencies in the output of D/A converter 8 which are higher than the ones of interest in aeroengine noise analysis, these frequencies being the ones originated by the PRBS generator 2 which are contained in the recursions of the $(\sin x/x)^2$ characteristic subsequent to the initial curve which reaches a null at $f=c$. The filter also serves the purpose of smoothing any "jaggedness" in the waveform of the tones originated digitally by the EPROM. Such jaggedness is of course more of a problem with waveforms defined by appreciably less than 128 data addresses, especially when the addresses are scanned at the lower of the two clock frequencies applied to address counter 40.

Turning now to FIG. 2, we see a simulated aeroengine noise spectrum such as might be produced by the device of FIG. 1 with an appropriate memory block selected for reading in the EPROM 6. The tones are at 2 KHz, plus 2nd, 3rd and 4th harmonics at 4,6 and 8 KHz respectively. Alternative tones plus harmonics, or just pure tones, may be produced merely by changing the input clock frequency to the address counter 40, or selecting a different memory block to be read, using the sector control switch 42. The broadband noise component is rolling off with the desired $(\sin x/x)^2$ characteristic given by the relative low input clock frequency to PRBS generator 2 (plus the effect of the buffer 12).

Although the above description relates to an 8-bit system, 12- or 16-bit systems may be required in some circumstances where longer data word lengths are needed to give the output audio signal greater dynamic range. Also within the scope of the invention are tones defined by clock frequencies other than those disclosed above, or defined by a greater number of data values than the 128 addresses referred to above.

Whilst any number of tones and their harmonics may be included as data in the EPROM address blocks, it may be particularly desireable to include in one of the address blocks data relating to 1 cycle of a sine wave which when read out of the address block by one of the applied clock frequencies will produce a much lower tone say, 250 Hz) than those mentioned above. Its purpose would be to represent a known acoustic level in order to ensure that the response of the only non-digital (and therefore non-exact) parts of the device, namely the D/A converter and buffer, are accurately calibrated.

Although the digital noise generator has been described as having an analogue signal output, it could of course have a digital signal output instead if the D/A converter 8 and buffer 12 were omitted. Such a digital output could be fed directly into digital analysis equipment where possible, thus bypassing conversion both into and out of the analogue domain. It is expected that the part of the $(\sin x/x)^2$ characteristic being used will have a suitable roll-off even without being modified by the buffer 12.

Although the digital noise generator has been described entirely in terms of a specialist use in the aircraft industry, such a generator could be used to synthesise alternative types of noise spectra with pseudo-random and tone components.

We claim:

1. A digital noise generator for synthesising a noise spectrum representative of the noise spectrum of a gas turbine aeroengine, the digital noise generator including:
   an oscillator having a high pulse frequency output;
   a pseudo-random binary sequence generator driven by a low frequency clock signal derived from the output of the oscillator thereby to produce a pseudo-random digital noise signal with a spectrum having a broadband pink noise component in the audio range;
   a read-only memory having at least one memory block therein containing simulated tone data in memory address sequence order;
   means for addressing the at least one memory block whereby the simulated tone data is outputted from the read-only memory in memory address sequence order thereby to produce a tone signal in digital form; and
   means for selectively summing the pseudo-random digital noise signal and the tone signal thereby to produce the noise spectrum signal.

2. A digital noise generator according to claim 1 in which the means for summing the pseudo-random noise signal and the tone signal comprises a digital-to-analogue converter, the pseudo-random noise signal being fed to the most significant bit input of the digital-to-analogue converter, and the tone signal being fed to the lower bit inputs thereof thereby to produce the noise spectrum signal in analogue form.

3. A digital noise generator according to claim 1 in which the read-only memory comprises a plurality of memory blocks each containing simulated tone data in memory address sequence order, the digital noise generator further comprising means for selectively addressing the memory blocks whereby the simulated tone data is outputted from the selected memory block in memory address sequence order thereby to produce a selected tone signal in digital form.

4. A digital noise generator according to claim 1 in which the read-only memory is addressed by an address counter provided with a clock frequency input switchable between a plurality of clock frequencies, whereby a block of memory being addressed can be addressed at a plurality of rates in order to produce a corresponding plurality of tones from the simulated tone data held in the memory block.

5. A digital noise generator comprising a clock signal generator, a pseudo-random binary sequence generator, a read-only memory linked to an address counter, and means connected to the pseudo-random binary sequence generator and the read-only memory for summing their outputs to produce a digital signal for conversion to analogue form, wherein the pseudo-random binary sequence generator and the address counter are driven by clock signals from the clock signal generator means, the pseudo-random binary sequence generator thereby outputting a pseudo-random noise signal, the read only memory containing simulated tone data addressable by the address counter at a rate determined by the relevant clock signal to output the tone data for summing with the random noise signal.

* * * * *

UNITED STATES PATENT AND TRADEMARK OFFICE
CERTIFICATE OF CORRECTION

PATENT NO. : 4,673,871

DATED : June 16, 1987

INVENTOR(S) : John D. Brown; Peter Gladdish; Michael A. McCormick

It is certified that error appears in the above–identified patent and that said Letters Patent are hereby corrected as shown below:

On the Title Page, Item [73]:

Please change the name of Assignee from Rolls-Royce Limited to

Rolls-Royce plc

Signed and Sealed this

Fifteenth Day of December, 1987

Attest:

DONALD J. QUIGG

Attesting Officer      Commissioner of Patents and Trademarks